(12) United States Patent
Lee et al.

(10) Patent No.: US 8,860,163 B2
(45) Date of Patent: Oct. 14, 2014

(54) OPTICAL STRUCTURE OF SEMICONDUCTOR PHOTOMULTIPLIER AND FABRICATION METHOD THEREOF

(75) Inventors: Joon Sung Lee, Daejeon (KR); Yong Sun Yoon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 59 days.

(21) Appl. No.: 13/324,973

(22) Filed: Dec. 13, 2011

(65) Prior Publication Data

US 2012/0153420 A1   Jun. 21, 2012

(30) Foreign Application Priority Data

Dec. 17, 2010 (KR) .................. 10-2010-0129841

(51) Int. Cl.
| | | |
|---|---|---|
| H01L 29/72 | (2006.01) | |
| G01T 1/24 | (2006.01) | |
| G01J 1/02 | (2006.01) | |
| H01L 31/0232 | (2014.01) | |
| G01T 1/20 | (2006.01) | |
| G01J 1/04 | (2006.01) | |
| H01L 27/146 | (2006.01) | |

(52) U.S. Cl.
CPC .......... H01L 31/02327 (2013.01); G01T 1/248 (2013.01); G01J 1/0214 (2013.01); G01T 1/2002 (2013.01); G01J 1/0407 (2013.01); H01L 27/14627 (2013.01)

USPC .......................................................... 257/432

(58) Field of Classification Search
USPC .......................................................... 257/432
See application file for complete search history.

(56) References Cited

U.S. PATENT DOCUMENTS

| | | | | |
|---|---|---|---|---|
| 6,163,407 A | * | 12/2000 | Okazaki et al. ............... | 359/619 |
| 2005/0208432 A1 | | 9/2005 | Conley, Jr. et al. | |
| 2005/0211665 A1 | * | 9/2005 | Gao et al. ..................... | 216/26 |
| 2009/0104731 A1 | * | 4/2009 | Fujisawa ....................... | 438/72 |

FOREIGN PATENT DOCUMENTS

| | | |
|---|---|---|
| JP | 2004-177307 A | 6/2004 |
| KR | 1020070051782 A | 5/2007 |
| KR | 1020090129123 A | 12/2009 |

* cited by examiner

*Primary Examiner* — Edward Wojciechowicz

(57) ABSTRACT

Disclosed is an optical structure formed in an upper side of a semiconductor photomultiplier having a plurality of microcells. The optical structure includes: a first dielectric body formed in an upper side of a dead area between light receiving areas of the respective microcells and having a cross-sectional structure in which a lower side is wider than an upper side; and a second dielectric body formed in the upper side of the light receiving area of each microcell and having a cross-sectional structure in which a lower side is narrower than an upper side, and a refractive index of the second dielectric body is higher than that of the first dielectric body.

8 Claims, 4 Drawing Sheets

OPTICAL STRUCTURE OF SEMICONDUCTOR PHOTOMULTIPLIER AND FABRICATION METHOD THEREOF

CROSS-REFERENCE TO RELATED APPLICATIONS

This application is based on and claims priority from Korean Patent Application No. 10-2010-0129841, filed on Dec. 17, 2010, with the Korean Intellectual Property Office, the present disclosure of which is incorporated herein in its entirety by reference.

TECHNICAL FIELD

The present disclosure relates to an upper optical structure of a semiconductor photomultiplier and a fabrication method thereof. More particularly, the present disclosure relates to an upper optical structure of a semiconductor photomultiplier that improves light receiving efficiency by guiding incident light toward a dead area to a light receiving area by forming a planar prism structure on the top of a photo multiplier element, and a fabrication method thereof.

BACKGROUND

As a semiconductor optical sensor used to detect feeble light, an avalanche photodiode has been developed and used. This diode may be fabricated by using various semiconductor materials such as InP, GaAs, SiGe, and SiC. For example, the avalanche photodiode fabricated by using silicon has a diode structure in which doped layers of p+, n, n−, and n+ or n+, p, p−, and p+ are stacked in parallel to a light receiving surface and operates by applying a voltage slightly lower than a breakdown voltage in a reverse direction to the diode. When a photon is incident in this diode, a pair of electron/hole is generated by photoexcitation. Avalanche multiplication occurs while the pair of electron/hole is accelerated by an electric field, so that the amount of current is amplified to detect weak light with high sensitivity.

Based on such basic structure and operational principle of the avalanche photodiode, a semiconductor photomultiplier operated in a Geiger mode has been developed. The device is similar to an avalanche photodiode, but is to be operated in a voltage range which exceeds the breakdown voltage. According to the operating mode of the device, the number of charge carriers generated by photoexcitation is progressively increased through impact ionization, and a breakdown phenomenon in which charges accumulated in the diode structure flow in a moment occurs. The current-to-photon gain is determined by the overvoltage—the operation voltage subtracted by the device breakdown voltage—, regardless of the number of photons simultaneously incident in a single diode.

In such a Geiger mode photomultiplier type detector, multiple microcells composed of the diode structure connected to each other in parallel constitute one device, and the intensity of current signals simultaneously generated from the microcell array is measured to determine the number of incident photons on the device. Therefore, the dynamic range of the light intensity measurement depends on the area of a single microcell and the number of the microcells to the total area of the device, and a high-density cell pattern is needed in order to improve the dynamic range. Herein, it is noted that when breakdown occurs in one cell, the cell becomes inoperable for some time, and that when a large current flows continuously, the device may be damaged. Therefore, the device needs to be restored from the breakdown state within a short time. To this end, a passive quenching method in which a quench resistor is connected in series to the diode structure of the microcell is generally applied. The quench resistor causes ohmic voltage drop to decrease the voltage applied to the device down to the breakdown voltage when a surge current flows by electrical breakdown, thereby quenching the breakdown state.

When the photon number measurement device is implemented as above through the multiple microcell configurations, the so-called optical crosstalk needs to be suppressed. When the breakdown occurs in one cell by the avalanche phenomenon, multiple photons may be generated during the impact ionization accompanied thereby, and when the photons are transferred to the adjacent cells, the breakdown phenomenon may additionally occur concurrently in the adjacent cells. In order to suppress the optical crosstalk phenomenon, a method of putting a distance between the light receiving units of the cells was primarily adopted in the related art.

In general, multiple microcell semiconductor photomultipliers are configured to maximally widen the actual light receiving area by placing the quench resistors and metal electrodes on the separation space between the cells. However, in the case of high-density cell structure, the ratio of the effective light receiving area to the total device area is significantly reduced due to the influence of the dead area such as the area covered with the quench resistors and the metal electrodes, and the separation area between the cell diodes.

In order to solve the problem, Korean Patent Application Laid-Open No. 10-2009-0129123 disclosed a method of refractively guiding light incident from the top of the device toward the light receiving area by forming a microlens at the upper side of each microcell of the device. However, in this method, there is a limit that the lens is configured by organic materials for which reflow is generally easy, while the refractive indices of these materials are limited to the range of 1.45 to 1.7. When the device fabricated by the above method is used in the air, the refractive index of the lens material is appropriate, but durability of the lens can be problematic. Meanwhile, when the device is used coupled with a scintillator as in a gamma ray detector, optical grease is applied to contact the top of the device to the scintillator. However, since the optical grease also has a refractive index of a similar value (approximately 1.5), the expected light harvesting effect by the lens becomes invalid.

According to the present disclosure, light incident in the dead area of the semiconductor photomultiplier is guided to the light receiving area through reflection and refraction to improve the light receiving efficiency of the device by forming an optical structure on the device.

SUMMARY

The present disclosure is directed to improving the light receiving efficiency of a semiconductor photomultiplier to enhance the performance thereof.

Further, the present disclosure has been made in an effort to make the light detection efficiency high while keeping the dynamic range wide by improving the light receiving efficiency via guiding the incident light onto the dead area of a device to the light receiving area, thereby preventing a reduction of the effective light receiving area ratio inevitably accompanied by high cell density of a semiconductor photomultiplier.

An exemplary embodiment of the present disclosure provides an optical structure of a semiconductor photomultiplier, which is formed on the upper side of the semiconductor photomultiplier having a plurality of microcells, including: a first dielectric body formed on the upper side of the dead area between the light receiving areas of the respective microcells and having a cross-sectional structure in which the lower side is wider than the upper side; and a second dielectric body formed on the upper side of the light receiving area of each microcell and having a cross-sectional structure in which the lower side is narrower than the upper side, where the refractive index of the second dielectric body is higher than that of the first dielectric body.

Another exemplary embodiment of the present disclosure provides a forming method of an optical structure of a semiconductor photomultiplier on the upper side of the semiconductor photomultiplier having a plurality of microcells, including: forming a first dielectric body on the upper side of the dead area between the light receiving areas of the respective microcells among the plurality of microcells and having a cross-sectional structure in which the lower side is wider than the upper side; filling the upper side of the light receiving area of each microcell with a second dielectric body to allow the upper side of the light receiving area of each microcell to have a cross-sectional structure in which the lower side is narrower than the upper side; and planarizing the surface of the device to expose both the first dielectric body and the second dielectric body on the surface, where the refractive index of the second dielectric body is higher than that of the first dielectric body.

The cell density needs to be made high in order to increase the light intensity measurement dynamic range of a semiconductor photomultiplier. To this end, the size of the light receiving area of a unit cell in a device needs to be reduced. However, there is a limit in reducing the gap between the cells in proportion thereto. Accordingly, as the size of the unit cell decreases, the effective light receiving area ratio of an entire device is rapidly reduced, and as a result, the light detection efficiency is also rapidly decreased. When an optical structure according to the exemplary embodiment of the present disclosure is applied to the semiconductor photomultiplier, some of the light incident on the dead area of the device is guided to the light receiving area to increase light receiving efficiency, so that the performance of the device can be improved by alleviating deterioration of the light detection efficiency caused by increase of the cell density.

Unlike the structure of the microlens in the related art suggested to improve the light receiving efficiency of the semiconductor photomultiplier, according to the exemplary embodiment of the present disclosure, excellent stability and durability is achieved due to an optical structure using an inorganic dielectric body generally used in semiconductor processes instead of a soft organic material, and since the range of the refractive indices of inorganic dielectric materials is wide, the optical characteristics required for the proper operation of the optical structure can be sufficiently implemented.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which forms a part hereof. The illustrative embodiments described in the detailed description, drawing, and claims are not meant to be limiting. Other embodiments may be utilized, and other changes may be made, without departing from the spirit or scope of the subject matter presented here.

Figure 1:
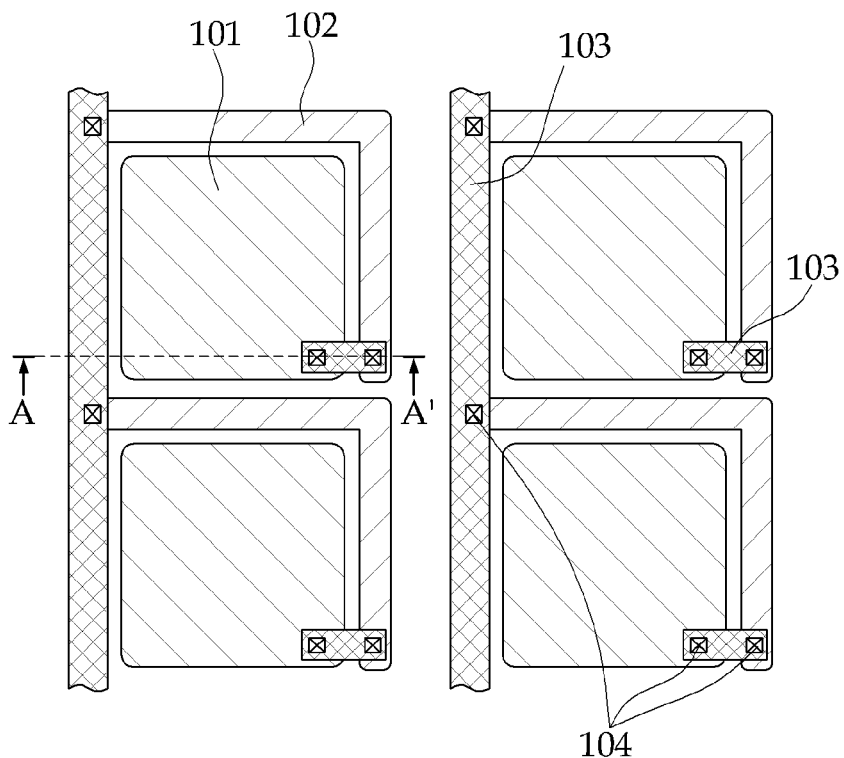
FIG. 1 is an exemplary plan view of a semiconductor photomultiplier.

FIG. 1 is a schematic plan view showing one example of a semiconductor photomultiplier device. As shown in FIG. 1, the semiconductor photomultiplier device is configured by connecting a plurality of microcells to each other in parallel.

A light receiving area 101 absorbing light has a plane diode structure and in light receiving area 101, electrical breakdown occurs when photoexcitation of an electron-hole pair occurs. All parts other than light receiving area 101 are dead areas.

A quench resistor 102 is connected with a cell diode containing light receiving area 101 in series and when a surge current flows by the electrical breakdown, ohmic voltage drop occurs to decrease the voltage applied to the cell diode down to the breakdown voltage, thereby quenching the breakdown state.

A metal electrode 103 serves to connect the bonding pad of the semiconductor photomultiplier device to quench resistor 102 and connect light receiving area 101 having the plane diode structure with quench resistor 102 in each cell.

An electrode contact 104 is made through an insulating layer to connect metal electrode 103 with other components, for example, light receiving area 101 and quench resistor 102.

Figure 2:
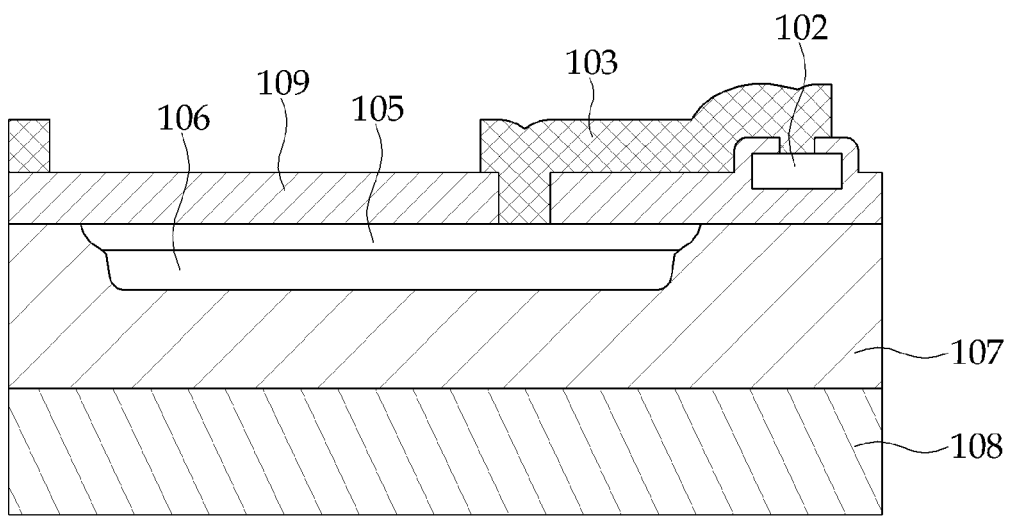
FIG. 2 is an exemplary cross-sectional view of a unit microcell of a semiconductor photomultiplier.

FIG. 2 is an exemplary cross-sectional view taken along line A-A' of FIG. 1.

An upper doped layer 105, a junction doped layer 106, and an intermediate layer 107, and a buried layer 108, which are stacked in the unit microcell of the semiconductor photomultiplier, may be made of semiconductor materials and for example, these layers may be made of silicon. Upper doped layer 105, junction doped layer 106, intermediate layer 107, and buried layer 108 are discriminated from each other according to the doping type and level and form a vertical diode structure. For example, upper doped layer 105, junction doped layer 106, intermediate layer 107, and buried layer 108 may be p+, n, n−, and n+ doped layers in sequence, respectively, or n+, p, p−, and p+ doped layers in sequence, respectively. Each of layers 105, 106, 107, and 108 may be formed by a method well known to those skilled in the art.

As shown in FIGS. 1 and 2, only a part of the entire area of the device may serve as the light receiving area in the semiconductor photomultiplier. When the cell number density is increased in order to improve the light intensity measurement dynamic range, the ratio of the light receiving area is further decreased.

FIG. 3A to FIG. 3E are cross-sectional views of forming process of an upper optical structure of a semiconductor photomultiplier according to an exemplary embodiment of the present disclosure. The present disclosure discloses a structure for guiding light incident on the upper side of the dead area to the light receiving area by forming an optical structure in the upper side of the semiconductor photomultiplier in order to solve the aforementioned problem. Although the semiconductor photomultiplier is made of different materials or the structure as shown in FIGS. 1 and 2 is changed, the upper optical structure of the semiconductor photomultiplier to be described below may be applied.

Figure 3A:
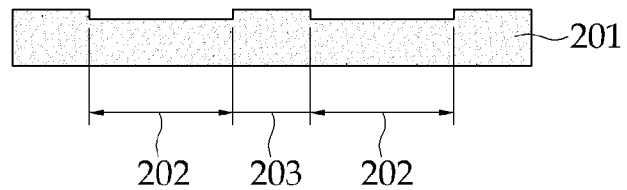
FIG. 3A to FIG. 3E are cross-sectional views of forming process of an upper optical structure of a semiconductor photomultiplier according to an exemplary embodiment of the present disclosure.

FIG. 3A shows a semiconductor photomultiplier device 201 (hereinafter, referred to as a photomultiplier device) of a simplified form without the optical structure in the upper side thereof. Photomultiplier device 201 includes all of the components of the basic device such as the light receiving area, the quench resistor, the metal electrode, and other insulating layers shown in FIG. 1 and does not have the optical structure on the upper side of the device 201.

In FIG. 3A, a subsided part corresponds to a light receiving area 202 and a protruded part corresponds to a dead area 203 between the cells.

Figure 3B:
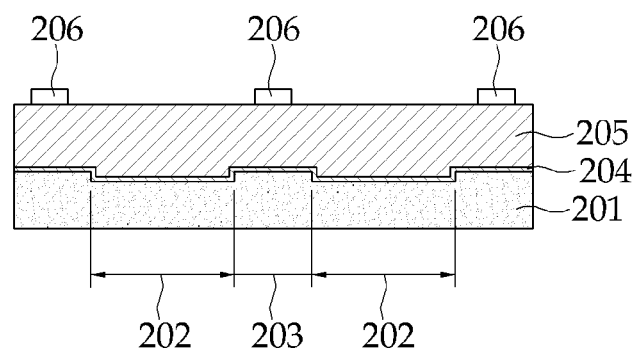

Referring to FIG. 3B, an etch stop layer 204 formed on photomultiplier device 201, a low refractive-index dielectric body 205, and photoresist 206 are shown.

Etch stop layer 204, which is a thin film formed to protect the surface of photomultiplier device 201, is made of a material less influenced by a selective etching process of low refractive-index dielectric body 205. Low refractive-index dielectric body 205 is made of a material which forms a component of the optical structure to be positioned on the upper side of dead area 203 of photomultiplier device 201 and has a relatively low refractive index. For example, as the material of etch stop layer 204, silicon nitride formed by a method such as PECVD which does not have a bad influence on the metal-deposited device may be selected, and as the material of low refractive-index dielectric body 205, silicon oxide formed by the same method may be selected. In this case, in order to further decrease the refractive index of low refractive-index dielectric body 205 or increase the etch rate of low refractive-index dielectric body 205, porous silicon oxide having high porosity may be formed by a method such as oblique-angle sputtering deposition. In this case, a silicon oxide layer having a refractive index of 1.1 or less may be formed.

Photoresists 206, which function as the masks required to etch low refractive-index dielectric body 205, allow only a part of the low refractive-index dielectric body 205 where photoresists 206 are not positioned on the upper side to be etched away, that is, the upper side of light receiving area 202 to be selectively etched.

Figure 3C:
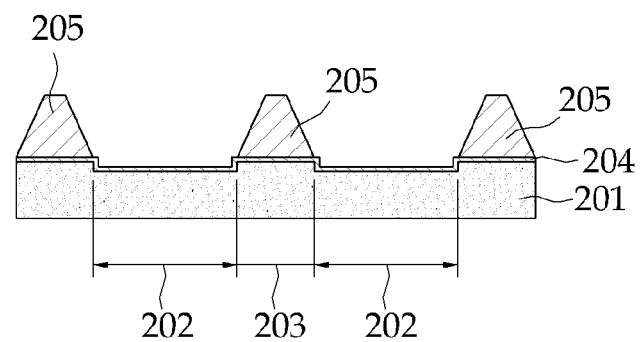

FIG. 3C shows a state after the etching and photoresist removing processes. Referring to FIG. 3C, the etched slope is oblique with a predetermined angle by appropriately controlling anisotropy of dry etching, so that the low refractive-index dielectric body 205 is shaped to have a trapezoidal cross section. As described above, through the selective etching of low refractive-index dielectric body 205, the low refractive-index dielectric body 205 is shaped on the upper side of dead area 203 to have a lower side wider than the upper side, that is, so as to have a cross section which conforms to a triangle or a trapezoid.

Figure 4A:
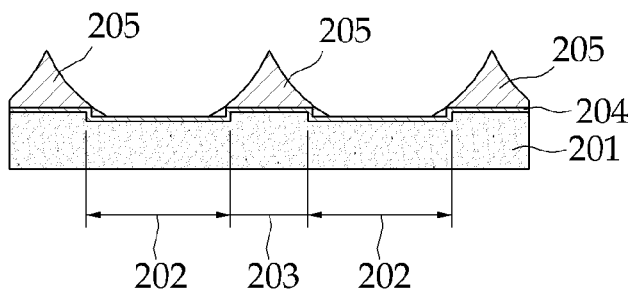
FIG. 4A to FIG. 4C are cross-sectional views of dielectric bodies having a low-refractive index formed at an upper side of a semiconductor photomultiplier according to another exemplary embodiment of the present disclosure.
Figure 4B:
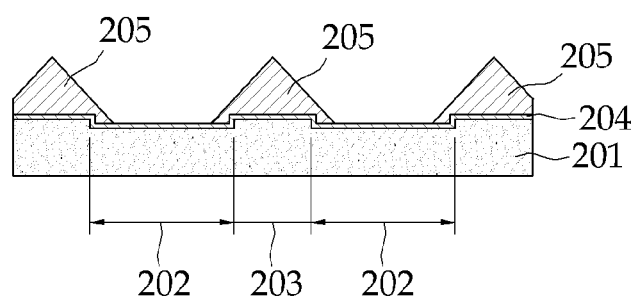
Figure 4C:
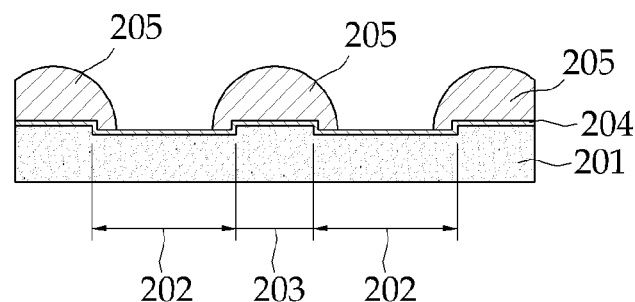

According to another exemplary embodiment of the present disclosure, as shown in FIG. 4A, low refractive-index dielectric body 205 may be etched to have a concave triangle-shaped cross section by isotropic wet etching. Further, as shown in FIG. 4B, low refractive-index dielectric body 205 may be etched to have a triangular cross section by appropriately controlling anisotropy of dry etching. Further, as shown in FIG. 4C, low refractive-index dielectric body 205 may be formed to have a semicircular cross section. Besides, low refractive-index dielectric body 205 may be shaped to have various cross sections in which the lower side is wider than the upper side, including a parabolic shape.

Referring back to FIG. 3D, a high refractive-index dielectric body 207 made of a material having a higher refractive index than low refractive-index dielectric body 205 is formed on the device after the low refractive-index dielectric body 205 is shaped according to the disclosure and thereafter, the top surface is planarized through a process such as chemical-mechanical planarization (CMP). That is, the material of high refractive-index dielectric body 207 is applied to fill the spaces between the low refractive-index dielectric bodies 205. Thereafter, the top surface is planarized to expose both the first dielectric body and the second dielectric body to the surface.

For example, when silicon oxide is used as the material of low refractive-index dielectric body 205, silicon nitride may be selected as the material of high refractive-index dielectric body 207. Further, when porous silicon oxide is used as the material of low refractive-index dielectric body 205, high density silicon oxide having a refractive index of 1.4 or more may be selected as the material of high refractive-index dielectric body 207 instead of silicon nitride.

As such, according to the exemplary embodiment of the present disclosure, high refractive-index dielectric body 207 can be made to have higher refractive index than low refractive-index dielectric body 205 by choosing various materials in combination. Light incident toward dead area 203 can be guided toward light receiving area 202 with the help of refraction and reflection of incident light at the oblique interface between the two dielectric bodies caused by a difference in the refractive indices.

Figure 3D:
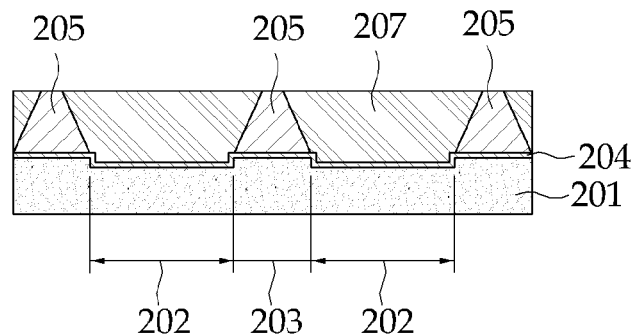
Figure 3E:
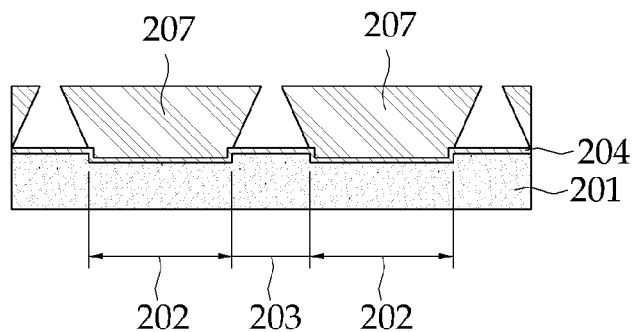

FIG. 3E shows a structure in which low refractive-index dielectric body 205 is removed and filled with air having a refractive index of approximately 1.0 by fully removing the part of low refractive-index dielectric body 205 through wet etching after FIG. 3, thereby further increasing the contrast between the refractive indices. For example, when silicon oxide is initially used to fill the volume occupied by the low refractive-index dielectric body 205 and silicon nitride is used as the materials of etch stop layer 204 and high refractive-index dielectric body 207, the silicon oxide may be selectively removed by wet etching using hydrofluoric acid (HF)-based etchant. Further, even when low refractive-index dielectric body 205 and high refractive-index dielectric body 207 are initially formed with porous silicon oxide and high density silicon oxide, respectively, the porous silicon oxide may be selectively removed by controlling wet etching conditions.

The upper optical structure of photomultiplier device 201 shown in FIGS. 3D and 3E guides some of incident light toward dead area 203 to light receiving area 202 by reflecting or refracting the light at the oblique interfaces between the dielectric body 205 and 207, by means of the prism formed with high refractive-index dielectric body 207.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An optical structure of a semiconductor photomultiplier, which is formed over an upper side of the semiconductor photomultiplier having a plurality of microcells, the optical structure comprising:

a first dielectric body formed in a dead area between light receiving areas of the respective microcells and over an upper surface of a substrate in the dead area, the first dielectric body having a cross-section in which a lower side is wider than an upper side;

a second dielectric body formed in the a light receiving area of a microcell and over an upper surface of the substrate in the light receiving area, the second dielectric body having a cross-section in which a lower side is narrower than an upper side; and an etch stop layer disposed between the upper surface of the substrate and the first and second dielectric bodies, the etch stop layer including a different material from the first dielectric layer, wherein a refractive index of the second dielectric body is higher than that of the first dielectric body.

2. The optical structure of a semiconductor photomultiplier of claim 1, wherein the first dielectric body has a concave triangular, a trapezoidal, a triangular, a semicircular, or a parabolic structure.

3. The optical structure of a semiconductor photomultiplier of claim 1, wherein top surfaces of the first dielectric body and the second dielectric body are coplanar.

4. The optical structure of a semiconductor photomultiplier of claim 1, wherein the first dielectric body includes silicon oxide, the second dielectric body includes silicon nitride, and the etch stop layer is a silicon nitride layer.

5. The optical structure of a semiconductor photomultiplier of claim 1, wherein the first dielectric body includes porous silicon oxide, the second dielectric body includes high density silicon oxide, and the etch stop layer is a silicon nitride layer.

6. The optical structure of a semiconductor photomultiplier of claim 1, wherein the first dielectric body includes air.

7. The optical structure of a semiconductor photomultiplier of claim 3, wherein a side surface of the first dielectric body extends to the etch stop layer and abuts a side surface of the second dielectric body so that the cross-section of the second dielectric body is defined by the first dielectric body and the etch stop layer.

8. The optical structure of a semiconductor photomultiplier of claim 1, wherein a refractive index of the second dielectric body 1.4 or more and a refractive index of the first dielectric body is 1.1 or less.

* * * * *